US008729697B2

(12) United States Patent
Theuss et al.

(10) Patent No.: US 8,729,697 B2
(45) Date of Patent: May 20, 2014

(54) SENSOR ARRANGEMENT, A MEASUREMENT CIRCUIT, CHIP-PACKAGES AND A METHOD FOR FORMING A SENSOR ARRANGEMENT

(75) Inventors: Horst Theuss, Wenzenbach (DE); Klaus Elian, Alteglofsheim (DE)

(73) Assignee: Infineon Technologies AG, Neubiberg (DE)

( * ) Notice: Subject to any disclaimer, the term of this patent is extended or adjusted under 35 U.S.C. 154(b) by 201 days.

(21) Appl. No.: 13/345,865

(22) Filed: Jan. 9, 2012

(65) Prior Publication Data
US 2013/0175527 A1    Jul. 11, 2013

(51) Int. Cl.
*H01L 21/04*    (2006.01)
(52) U.S. Cl.
USPC .... 257/730; 257/666; 257/678; 257/E23.004; 257/E23.181; 438/106; 438/123; 438/124

(58) Field of Classification Search
USPC ......... 257/666, 676, 678, 680, 729, 730, 787, 257/E23.002, E23.004, E23.135, E23.181, 257/E23.193, E23.194; 438/106, 123, 124
See application file for complete search history.

(56) References Cited

U.S. PATENT DOCUMENTS

| | | | |
|---|---|---|---|
| 6,441,503 B1* | 8/2002 | Webster | 257/787 |
| 7,781,852 B1* | 8/2010 | Faheem et al. | 257/419 |
| 8,148,806 B2* | 4/2012 | Lin et al. | 257/686 |
| 2005/0085033 A1* | 4/2005 | Magni et al. | 438/232 |
| 2010/0297797 A1* | 11/2010 | Ziglioli et al. | 438/49 |
| 2011/0227173 A1* | 9/2011 | Seppala et al. | 257/415 |
| 2012/0012949 A1* | 1/2012 | Winkler et al. | 257/415 |
| 2013/0122655 A1* | 5/2013 | Yu et al. | 438/121 |
| 2013/0172869 A1* | 7/2013 | Bonfeld | 606/33 |

* cited by examiner

*Primary Examiner* — Eduardo A Rodela

(57) ABSTRACT

A sensor arrangement is provided, the sensor arrangement including a chip including a sensor circuit configured to detect a bending of the chip; and a package structure configured to protect the chip; wherein the package structure includes a first region and a second region, and wherein the package structure is configured such that it is easier to be deformed in the first region than in the second region.

25 Claims, 7 Drawing Sheets

~ 300

| Forming a package structure including a first region and a second region to protect a chip, the chip including a sensor circuit for detecting a bending of the chip; wherein the package structure includes a first region and a second region, wherein the first region is more easily deformed than the second region |  310 |

US 8,729,697 B2

SENSOR ARRANGEMENT, A MEASUREMENT CIRCUIT, CHIP-PACKAGES AND A METHOD FOR FORMING A SENSOR ARRANGEMENT

TECHNICAL FIELD

Various embodiments relate generally to a sensor arrangement, a measurement circuit, chip-packages and a method for forming a sensor arrangement.

BACKGROUND

Mechanical tension and loads may be measured for various purposes. For example, measurements may be made to determine fatigue in materials, such as materials used in engineering and construction. Existing methods for checking and determining a load to a material may be based on detecting structural changes to the material. Such methods may involve consuming or destroying the material. Mechanical tension and loads may be measured to detect intentionally applied stress, for example in steering rods, or in operating parts of equipment. Torsion, torque, or bending may be detected in operating parts, e.g. steering rods.

SUMMARY

Various embodiments provide a sensor arrangement, the sensor arrangement including a chip including a sensor circuit configured to detect a bending of the chip; and a package structure configured to protect the chip; wherein the package structure includes a first region and a second region, and wherein the package structure is configured such that it is easier to be deformed in the first region than in the second region.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over", used herein to describe forming a feature, e.g. a layer, "over" a side or surface, may be used to mean that the feature, e.g. the layer may be formed "directly on", e.g. in direct contact with, the implied side or surface. The word "over", used herein to describe forming a feature, e.g. a layer "over" a side or surface, may be used to mean that the feature, e.g. the layer may be formed "indirectly on" the implied side or surface with one or more additional layers being arranged between the implied side or surface and the formed layer.

Various embodiments provide a semiconductor chip, e.g. a Complementary Metal Oxide Semiconductor (CMOS) chip with piezoresistive channels, which may respond to mechanical stress.

Stress sensitivity measurements may be carried out by a chip, for example, by means of a Metal Oxide Semiconductor Field Effect Transistor (MOSFET) current mirror circuit cell.

Figure 1A:
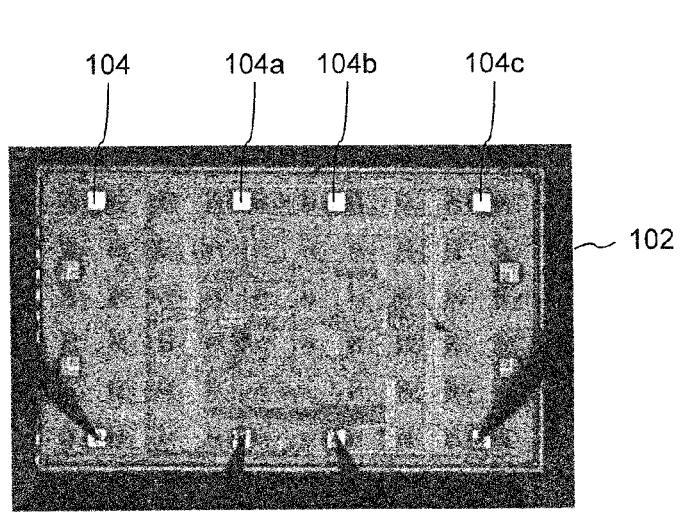
FIG. 1A shows a chip including sensing cells according to an embodiment.
Figure 1B:
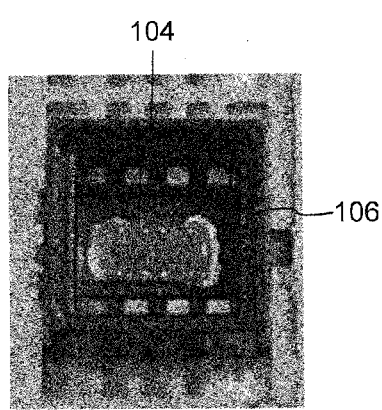
FIG. 1B shows a chip attached to a chip package.

FIG. 1A shows a chip 102 including a plurality of sensing cells 104. Chip 102 may include a 6×10 sensing cell array 104, 104b, 104c etc. It should be noted that any other number of cells may be provided in a cell array in accordance with various embodiments. Furthermore, the sensing cells do not necessarily need to be (but may be) arranged in lines and columns, but may also be arbitrarily arranged within the array, e.g. in accordance with a zig zag pattern or in accordance with any other regular or irregular pattern. Chip 102 according to FIG. 1A, may have a dimension of 2.93 mm×1.81 mm. Test needles of a high-frequency HF probe may be used to detect stress applied to a sensing cell 104 of chip 102. Stress-test chips 102 which may measure mechanical tension and loads may be normally glued to a chip-package 106, e.g. a dual small outline flat DSOF Package, as shown in FIG. 1B.

Figure 2A:
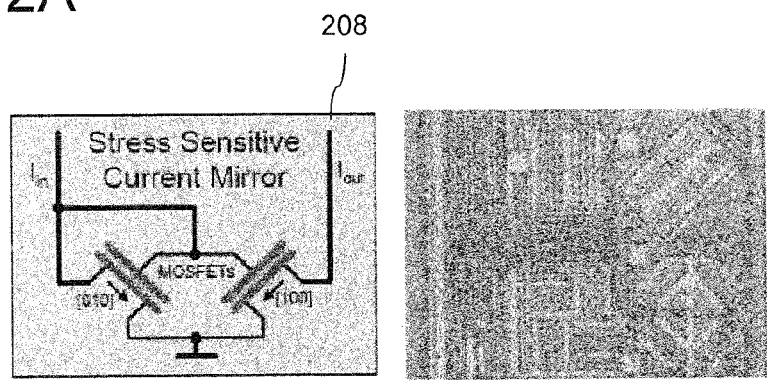
FIGS. 2A and 2B show a stress sensitive measurement circuit, and an electrical stress measurement according to an embodiment.
Figure 2B:
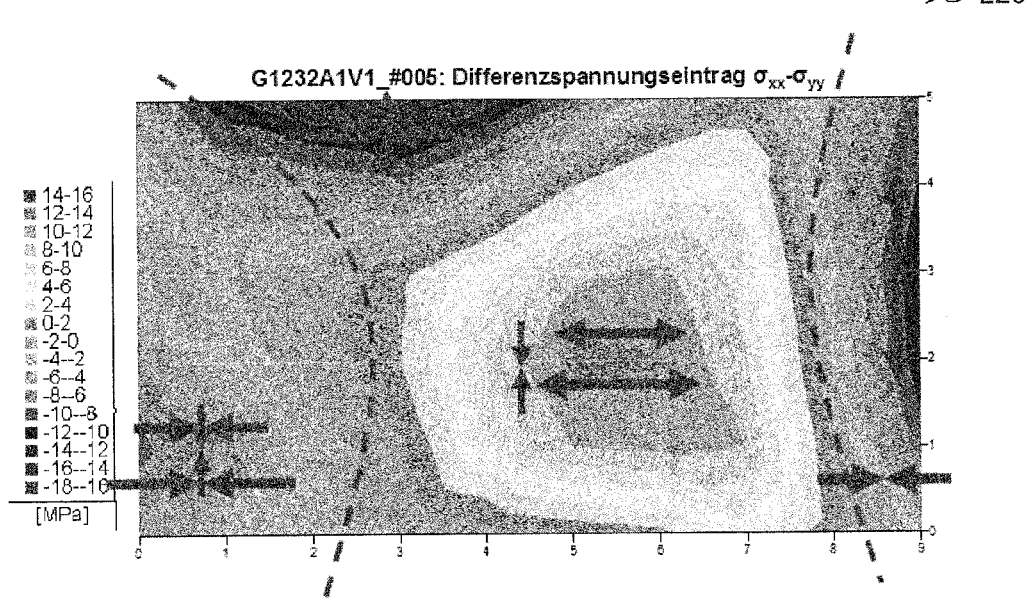

Each sensing cell 104 may include a stress sensitive current mirror measurement cell 208 with several transistor orientations, as shown in FIG. 2A. The measurement cell 208 of FIG. 2A is shown at 50× magnification. Electrical stress measurements may be carried, such as shown in graph 220 of FIG. 2B, wherein delta changes in the xx-yy tensions are obtained by a difference in stress in the x-axis direction (in general in a first direction) and difference in stress in a y-axis direction (in general in a second direction, which may be different from the first direction, which may e.g. be perpendicular to the first direction), e.g. $\sigma_{xx} - \sigma_{yy}$.

Various embodiments provide a sensor arrangement which may be used to measure spin, e.g. torque, applied to the sensor arrangement.

Various embodiments provide a package for a sensor chip which allows defined mechanical loads to be applied to the chip. The sensor chip device may detect mechanical stress of the environment, e.g. the mold material in which the device may be mounted.

Various embodiments provide a housing for protecting a stress measurement circuit, wherein mechanical stress transfers onto the chip may be defined through a selection of the housing, e.g. housing substrate geometries, e.g. housing substrate materials, assembled on the active chip surface.

Figure 3:
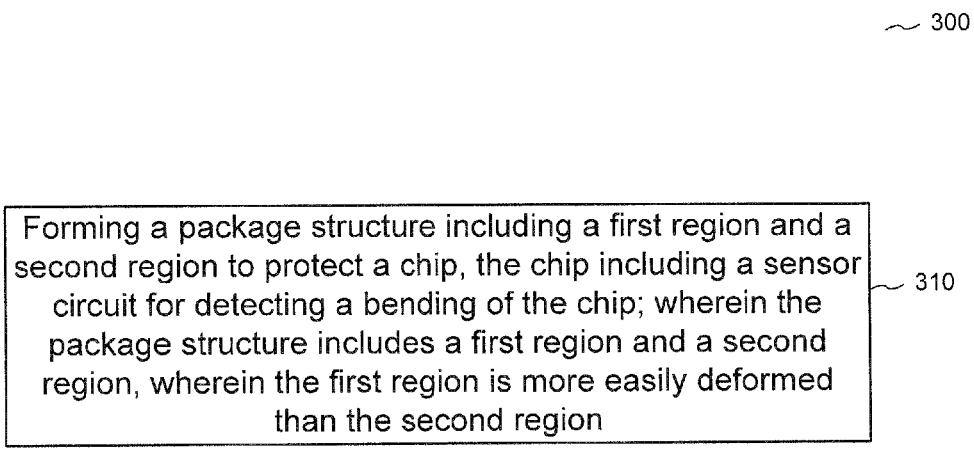
FIG. 3 shows a method for forming a sensor arrangement according to an embodiment.

FIG. 3 shows method 300 for forming a sensor arrangement according to an embodiment. The method may include forming a package structure including a first region and a second region to protect a chip, the chip including a sensor circuit for detecting a bending of the chip; wherein the package structure includes a first region and a second region, wherein the first region is more easily deformed than the second region (in 310).

Figure 4:
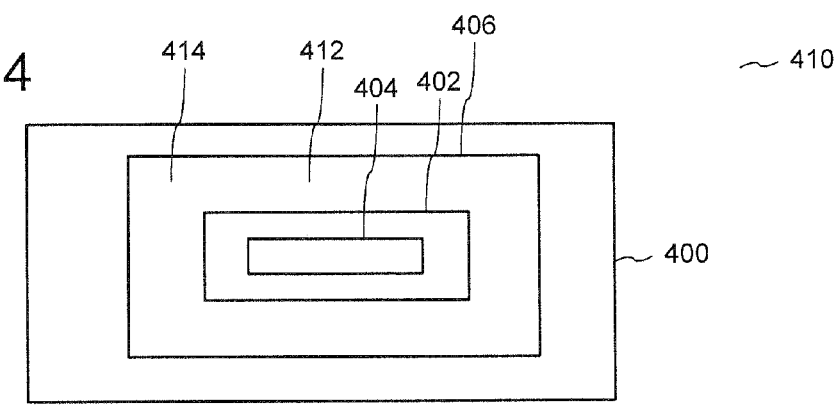
FIG. 4 shows a sensor arrangement according to an embodiment.

FIG. 4 shows sensor arrangement 400 according to an embodiment. Sensor arrangement 400 may include chip 402 including sensor circuit 404 configured to detect a bending of chip 402. Sensor arrangement 400 may include package structure 406 configured to protect chip 402; wherein package structure 406 may include first region 412 and second region 414, and wherein package structure 406 may be configured such that it is easier to be deformed in first region 412 than in second region 414.

According to various embodiments, first region 412 may be arranged adjacent to chip 402.

According to various embodiments, first region 412 may be configured to at least partially surround at least part of sensor circuit 404.

According to various embodiments, first region 412 may be mechanically coupled to sensor circuit 412.

According to various embodiments, first region 412 may be configured such that it is easier to be deformed with the bending of chip 402 than second region 414.

According to various embodiments, chip 402 may include at least one from the following group of sensors, the group consisting of: a temperature sensor, a humidity sensor, a chemical sensor, a biochemical sensor, a stress sensor, and the like.

According to various embodiments, chip 402 may include at least one from the following group of materials, the group consisting of: silicon; germanium; a polymer; an organic polymer; an organic semiconductor; a conductive polymer, e.g. polyacetylene, polypyrole, polyiimide, polyanilin; plastic; a compound semiconductor; a binary semiconductor, e.g. a III-V semiconductor, e.g. GaAs, GaSb, GaP, GaN, InP, InAs, InSb, a II-VI semiconductor, e.g. ZnO, ZnS, ZnSe, ZnTe, CdS, CdSe, CdTe; or a ternary semiconductor, e.g. AlGaAs, AlGaN.

According to various embodiments, chip 402 may include a stack of a plurality of chips 402A, 402B (not shown).

According to various embodiments, chip 402 may include a thickness ranging from about 5 µm to about 1 mm, e.g. about 50 µm to about 500 µm, e.g. about 180 µm to about 220 µm.

According to various embodiments, package structure 406 may include at least one from the following group of materials, the group consisting of: filled or unfilled epoxy, pre-impregnated composite fibers, laminate, a mold material, a thermoset material, a thermoplastic material.

Figure 5:
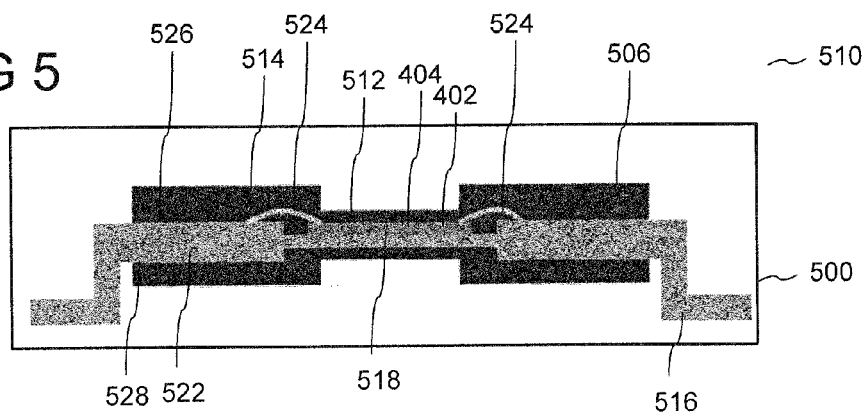
FIG. 5 shows a sensor arrangement according to an embodiment.

FIG. 5 shows sensor arrangement 500 according to an embodiment.

Sensor arrangement 500 may include chip 402 which may include sensor circuit 404 configured to detect a bending of chip 402. Sensor circuit 404 may include a measurement circuit such as a stress sensitivity measurement circuit, e.g. a current mirror stress sensitivity circuit, such as the current mirror stress sensitivity circuit described with respect to FIGS. 2A and 2B. Sensor arrangement 500 may include package structure 506 configured to protect chip 402. Package structure 506 may include a material configured to electrically isolate chip 402, and to physically protect chip 402. Package structure 506 may include an isolation material, e.g. an electrically insulating material. Package structure 506 may include at least one from the following group of materials, the group consisting of: filled or unfilled epoxy, pre-impregnated composite fibers, laminate, a mold material, a thermoset material, a thermoplastic material. Package structure 506 may be configured to surround chip 402 on one or more sides of chip 402, e.g. package structure 506 may be formed over chip 402, e.g. package structure 506 may be formed directly on chip 402.

Package structure 506 may include first region 512 and second region 514. Furthermore, package structure 506 may be configured such that it is easier to be deformed in first region 512 than in second region 514. Easier to be deformed may be understood to mean that in response to a predetermined load, first region 512 may exhibit a larger strain, i.e. a larger deformation, than second region 514.

First region 512 may be thinner than second region 514. For example, first region 512 may include a thickness ranging from about 30 µm to about 3 mm, e.g. about 50 µm to about 500 µm, e.g. about 70 µm to about 250 µm. Thickness may be measured as the height of the material of first region 512 from a surface of first region 512, e.g. a surface of first region 512 in contact with chip 402, to an opposite surface of first region 512. Second region 514 may include a thickness ranging from about 50 µm to about 3 mm, e.g. about 70 µm to about 800 µm, e.g. about 90 µm to about 300 µm. First region 512 may include a different material to second region 514, wherein first region 512 may be configured to exhibit a larger strain, i.e. a larger deformation, with respect to its original length, than second region 514.

First region 512 may be arranged adjacent to chip 402, e.g. first region 512 may be configured to surround chip 402 on one or more sides of chip 402, e.g. first region 512 may be formed over chip 402, e.g. first region 512 may be formed directly on chip 402. First region 512 may be formed over sensor circuit 404.

Second region 514 may be arranged adjacent to first region 512. Second region 514 may be configured to surround chip 402 on one or more sides of chip 402, e.g. second region 514 may be formed over chip 402, e.g. second region 514 may be formed directly on chip 402. Alternatively, second region 514 may be arranged adjacent to first region 512. Second region 514 may be configured to surround chip 402 on one or more sides of chip 402. Second region may be mechanically coupled to sensor circuit 404 through physical coupling with chip 402.

First region 512 may be configured to at least partially surround at least part of sensor circuit 404. First region 512 may be mechanically coupled to sensor circuit 404. First region 512 may be mechanically coupled to sensor circuit 404 through physical coupling with chip 402. First region 512 may be configured such that it is easier to be deformed with the bending of chip 402 than second region 514. Package structure 506, e.g. first region 512 of package structure 506, may be configured to demonstrate a deformation response to a load applied to the package structure 506, e.g. to first region 512 of package structure 506. Package structure 506, e.g. first region 512 of package structure 506, may be coupled to sensor circuit 404 via chip 402. Sensor circuit 404 may be configured to detect the deformation response of package structure 506, e.g. first region 512 of package structure 506, through a deformation in chip 402.

Chip 402 may be isolated, e.g. completely isolated from an external environment by package structure 506. In other words, package structure 506 may fully surround chip 402. In other words, package structure 506 may fully encapsulate chip 402. In other words, chip 402 may be isolated from external forces, e.g. applied loads, except through package structure 506. In other words, chip 402 may be completely isolated from external forces, e.g. applied loads, except through package structure 506.

Materials of a mechanical stress sensor package, e.g. materials used for encapsulation, e.g. mold materials 516, may therefore be adapted, particularly with respect to their mechanical properties, to allow for a predetermined bending of the package.

Various embodiments provide a chip package material, e.g. package structure 506, wherein the chip package material may have elastic properties, e.g. the package structure, may demonstrate reversibly elastic behavior with respect to an applied force.

Package structure 506, e.g. first region 512 of package structure 506, may be configured such that the bending of package structure 506, may not exceed an elastic limit of chip 402, e.g. a point wherein irreversible bending of the sensor chip is reached, or a breaking point of chip 402, e.g. a point wherein the sensor chip breaks. Therefore, package structure 506 may also serve to protect sensor chip 402. As a result, thinner chips 402, than in current sensor chips, as the package structure 506 may be relied on to prevent sensor chips from being damaged.

Chip 402 may include a semiconductor die. Chip 402 may include a stress sensor. Chip 402 may include at least one from the following group of sensors, the group consisting of: a temperature sensor, a humidity sensor, a chemical sensor, a biochemical sensor, a stress sensor. Chip 402 may include at least one from the following group of materials, the group consisting of: silicon, a polymer, plastic, a compound semiconductor, a III-V semiconductor, a II-VI semiconductor. Chip 402 may include a stack of a plurality of chips 402A, 402B (not shown). Chip 402 may have a thickness ranging from about 5 µm to about 1 mm, e.g. about 50 µm to about 500 µm, e.g. about 180 µm to about 220 µm. Chip 402 may be a flexible chip, e.g. a bendable chip. Chip 502 may include a pressure sensor, e.g. an air pressure sensor, e.g. a sensor for an airbag.

A force, e.g. an applied load, e.g. a bending force, e.g. a turning force, may be applied to package structure 506. The force may be applied indirectly to chip 402, e.g. via package structure 506. In other words, an external force applied to chip 402, e.g. to deform chip 402, may be applied to chip 402 through package structure 506, e.g. through first region 512 of package structure 506.

Package structure 506 may deform in response to the applied load. First region 512 may be more easily deformed than second region 514, therefore, a larger amount of strain may be transferred to chip 402 from first region 512 than second region 514.

Chip 402 may respond to the deformation of first region 512 more than to the deformation of second region 514. Therefore, deformation in chip 402 is more largely influenced by first region 512 than second region 514. Furthermore, first region 512 may be in closer proximity to chip 402 than second region 514, therefore, first region 512 may be configured to influence the deformation of chip 402 more than second region 514. The difference in the influence between first region 512 and second region 514 may be further due to choice of materials, e.g. elasticity, thickness, as discussed above. The deformation response of first region 512 of package structure 506 may be modified in relation to a geometric property of first region 512. The deformation response of first region 512 of package structure 506 may be modified in relation to a chemical property, e.g. a chemical composition, of first region 512. The deformation response of first region 512 of package structure 506 may be modified in relation to a physical property, e.g. elasticity, of first region 512.

In FIG. 5, chip-carrier 516 may be configured to carry chip 402. Chip-carrier 516 may include a leadframe. Chip 402 may be adhered over chip-carrier 516, e.g. via an adhesive glue, e.g. an adhesive paste. Chip 402 may be adhered directly on chip-carrier 516. Chip-carrier 516 may include first chip-carrier region 518 and second chip-carrier region 522. Chip-carrier 516 may be configured such that it is easier to be deformed in first chip-carrier region 518 than in second chip-carrier region 522. First chip-carrier region 518 may be arranged adjacent to chip 402. First chip-carrier region 518 may be configured such that it is easier to be deformed with the bending of chip 402 than second chip-carrier region 522, e.g. in response to an applied force. First region 512 may be arranged adjacent to first chip-carrier region 518. For example, chip 402 may be adhered over chip-carrier region 518 via an adhesive glue, e.g. an adhesive paste. First region 512 may be arranged over a top side of chip 402, and chip-carrier 516 may be configured to carry chip 402 from a bottom side of chip 402. Alternatively, first region 512 may be arranged over a bottom side of chip 402, and chip-carrier 516 may be configured to carry chip 402 from a top side of chip 402.

Chip-carrier 516 may isolate bottom side of chip 402 from an external environment. Therefore, chip 402 may be isolated, e.g. completely isolated, from an external environment by chip-carrier 516 and package structure 506.

First chip-carrier region 518 may be in closer proximity to chip 402 than second chip-carrier region 522. Therefore, first chip-carrier region 518 may be configured to influence the deformation of chip 402 more than second chip-carrier region 522. Therefore, deformation in chip 402 may be more largely influenced by first chip-carrier region 518 than second chip-carrier region 522.

First chip-carrier region 518 may have a thickness ranging from about 2 µm to about 5 mm, e.g. about 5 µm to about 2 mm, e.g. about 20 µm to about 500 µm.

Second chip-carrier region 522 may have a thickness ranging from about 5 µm to about 8 mm, e.g. about 20 µm to about 2 mm, e.g. about 30 µm to about 500 µm.

As used herein, the terms "top side" or "front side" of a chip may be understood to refer to the side of the chip, wherein the active components of the chip are formed. The terms "top side" or "front side" are used interchangeably hereinafter. The terms "bottom side" or "back side" are used interchangeably hereinafter. With respect to sensor chip 402, front side of the chip may refer to the side in which a measurement sensor circuit 404 may be formed. Bonding wires may be attached to the front side of chip 402. The bonding wires may be attached to specific contact pads, electrical contacts or, alternatively, may be attached to a larger part of the metallization that may cover most of the front side of chip 402.

The terms "bottom side" or "back side" of a chip may be understood to refer to the opposite side of the chip from the "front side" or "top side", e.g. "bottom side" or "back side" may face an opposite direction from the direction faced by chip "front side" or "top side".

One or more electrical contacts formed over front side of chip 402 may be electrically connected to chip-carrier 516 via electrically conductive wires 524.

First region 512 which may be more easily bendable than second region 514 may be arranged in closer proximity to chip 402 than second region 514.

First chip-carrier region 518, which may be more easily bendable than second chip-carrier region 522, may be arranged in closer proximity to chip 402 than second chip-carrier region 522.

First regions 512 and first chip-carrier region 518, which may be easier bendable regions, e.g. first region 512 may be more easily bendable than second region 514, and first chip-carrier region 518 may be more easily bendable than second chip-carrier region 522, may be arranged in closer proximity to chip 402 than second region 514 and second chip-carrier region 522. In other words, first region 512 may be configured to influence the deformation of chip 402 more than second region 514. In other words, first chip-carrier region 518 may be configured to influence the deformation of chip 402 more than second chip-carrier region 522.

Chip-carrier 516 may include at least one from the following group of materials, the group consisting of: tape, flexible tape, flex tape, a polymer, a plastic, a polymer resin, a metal, copper, an electrically conductive material, a thermally conductive material. Chip-carrier 516 may include a printed circuit board.

Chip 402 may be mounted onto a printed circuit board, e.g. chip-carrier 516, wherein the printed circuit board may be configured to bend with the bending of the chip.

Chip-carrier 516 may include one or more weakened regions, e.g. first region 512, within the leadframe, wherein the weakened regions may be susceptible to easier bending compared to other regions, e.g. second region 514, in response to an applied force.

Various embodiments therefore provide a thinned (less than 100 μm thick) stress test chip formed over a thinned leadframe.

First region 512 may be further arranged over a side of first chip-carrier region 518, e.g. first region 512 may be configured to cover first chip-carrier region 518 over at least one side, e.g. first region 512 may be configured to surround first chip-carrier region 518 first chip-carrier side 526 of chip-carrier 516 carrying chip 402, e.g. first region 512 may be configured to surround first chip-carrier region 518 over second chip-carrier side 526, opposite to the side of chip-carrier 516 carrying chip 402. Second chip-carrier side 528 may face an opposite direction to first chip-carrier side 526.

Second region 514 may be further arranged over a side of first chip-carrier region 518, e.g. second region 514 may be configured to surround first chip-carrier region 518 over at least one side, e.g. second region 514 may be configured to cover first chip-carrier region 518 over first chip-carrier side 526 carrying chip 402, e.g. first region 512 may be configured to surround first chip-carrier region 518 over second chip-carrier side 528 carrying chip 402.

Second region 514 may be further arranged over a side of second chip-carrier region 522, e.g. second region 514 may be configured to surround second chip-carrier region 522 over at least one side.

Sensor arrangement 500 may include a measurement device 500. Measurement device 500 may include chip 402 including a measurement circuit 404 for measuring deformation of chip 402, an isolation material 506 configured to at least partially surround chip 402 and to receive an applied load for deforming chip 402, isolation material 506 including first isolation region 512 and second isolation region 514; wherein first isolation region 512 may be configured to have a different deformation response to the applied load than second isolation region 514, and wherein first isolation region 512 may be configured to influence the deformation of chip 402 more than second isolation region 514.

Package structure 506 may be a chip package 506 which may include isolation material 506 configured to receive an applied load for deforming chip 402, chip 402 including a measurement circuit 404 for measuring deformation of chip 402; wherein isolation material 506 may be configured to at least partially surround chip 402, and wherein isolation material 506 may include first isolation region 512 and second isolation region 514; wherein first isolation region 512 may be configured to have a different deformation response to the applied load than second isolation region 514, and wherein first isolation region 512 may be configured to influence the deformation of chip 402 more than second isolation region 514.

Package structure 506 may be a chip package 506, which may be configured to protect chip 402 including sensor circuit 404 configured to detect a bending of chip 402; wherein package structure 506 may include first region 512 and second region 514, and wherein package structure 506 may be configured such that it is easier to be deformed in first region 512 than in second region 514.

Package structure 506 may tune the sensitivity of a sensor circuit 404 formed in chip 402. In other words, because first region 512 may be more easily deformed than second region 514, chip 402 may be more easily bent in response to the deformation of first region 512. Therefore sensor circuit 404 which may have produced a predetermined response to a predetermined load applied to a package structure not including first region 512, e.g. only including second region 514, may produce a larger response, i.e. exhibit a larger sensitivity, to the predetermined load due to the modification of first region 512.

Figure 6:
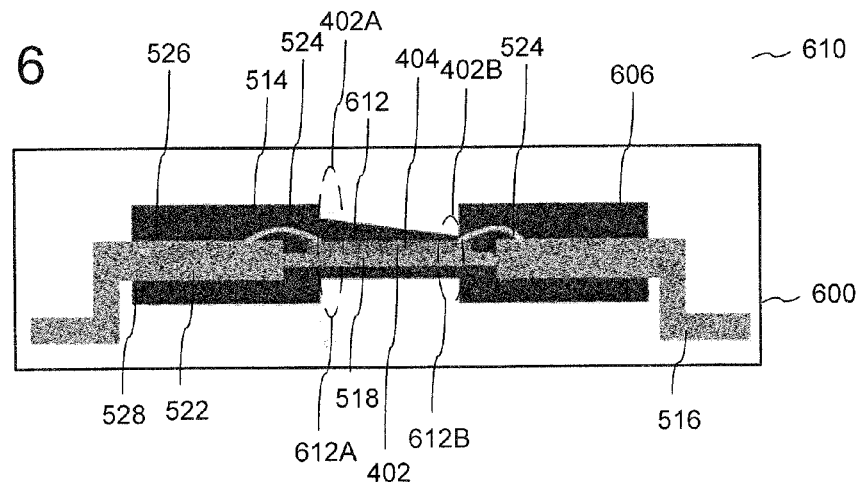
FIG. 6 shows a sensor arrangement according to an embodiment.

FIG. 6 shows sensor arrangement 600 according to an embodiment. Sensor arrangement 600 may include all the features described above with respect to sensor arrangement 500, except that first region 512 may be modified to first region 612. The basic functionalities of all the features described with respect to sensor arrangement 500 are applicable to sensor arrangement 600. First region 612 of package structure 606 may include one or more regions which are easier to be deformed than other regions in first region 612. In other words, first region 612 may be configured such that ease of deformity, in response to an applied load to first region 612, may vary within first region 612. First region 612 may be configured to have a varying thickness, e.g. a mold thickness gradient, e.g. first region 612 may be configured to have a thickness which decreases, e.g. linearly, e.g. non-linearly, from a first portion of first region 612A to a second portion of first region 612B. Due to a difference in thickness between first portion of first region 612A and second portion of first region 612B, second portion of first region 612B may be easier to be deformed than first portion of first region 612A.

As a result of second portion of first region 612B being easier to be deformed than first portion of first region 612A, a region of chip 402 may be more easily deformed than another region of chip 402, e.g. region 402B which may be in closer proximity to region 612B than region 402A, may be more easily deformed than region 402A, in response to an applied load, e.g. region 402A which may be in closer proximity to region 612A than region 402B, may be less easily deformed than region 40BA, in response to an applied load.

In other words, a sensor circuit 404B formed in region 402B of chip 402, may produce a larger response to the applied load, than a sensor circuit 404A formed in region 402A of chip 402. In other words, package structure 606 may tune the sensitivity of a sensor circuit 404B formed in chip 402 compared to sensor circuit 404A, in response to an applied load.

Figure 7:
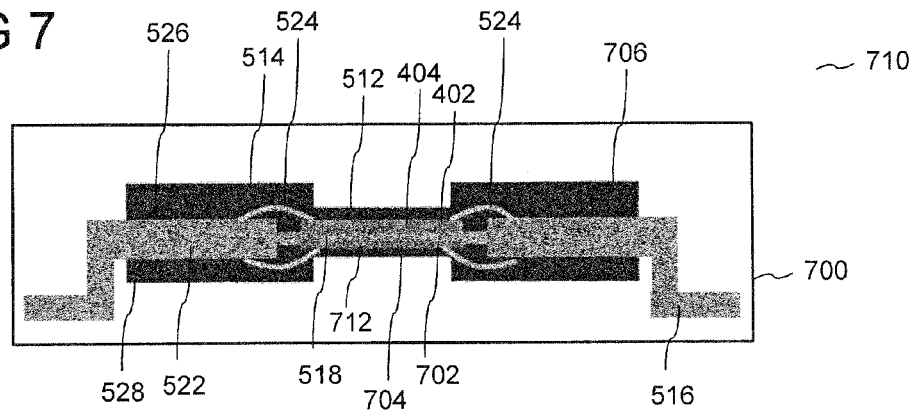
FIG. 7 shows a sensor arrangement according to an embodiment.

FIG. 7 shows sensor arrangement 700 according to an embodiment. The basic functionalities of all the features described with respect to sensor arrangement 500 are applicable to sensor arrangement 700. Sensor arrangement 700 may include all the features described above with respect to sensor arrangements 500, 600.

Sensor arrangement 700 may include further chip 702. Further chip 702 may include further sensor circuit 704. Further chip 702 may include chip 402 described above with respect to various embodiments. Sensor circuit 704 may include sensor circuit 404 described above with respect to various embodiments. Chip-carrier 518 may be configured to carry chip 402 over first chip-carrier side 526. Chip-carrier 518 may be further configured to carry further chip 702 over second chip-carrier side 528, wherein second chip-carrier side 528 may face an opposite direction to first chip-carrier side 526. Further chip 702 may be formed over an opposite side of chip-carrier 518 to chip 402. Chip 402 may be formed over first chip-carrier side 526 of first chip-carrier region 518. Chip 702 may be formed over second chip-carrier side 528 of first chip-carrier region 518. Chip 702 may be arranged adjacent to chip 402.

Package structure 706 may include one or more further regions 712, wherein package structure 706 may be configured such that it is easier to be deformed in the one or more further regions 712 than in the first region 512.

One or more further regions 712 of package structure 706 may include a material configured to electrically isolate chip 702, and to physically protect chip 702. Further region 712 of package structure 706 may be configured to surround chip 702 on one or more sides of chip 702, e.g. formed over chip 702, e.g. further region 712 of package structure 706 may be formed directly on chip 702.

Further region 712 of package structure 706 may be configured such that it is easier to be deformed in further region 712 than in second region 514 and in first region 512. Easier to be deformed may be interpreted to mean that in response to a predetermined load, first region 712 may exhibit a larger strain, i.e. a larger deformation, than second region 514 and first region 512.

Further region 712 of package structure 706 may be thinner than first region 512. For example, Further region 712 may include a thickness ranging from about 10 μm to about 3 mm, e.g. about 20 μm to about 250 μm, e.g. about 50 μm to about 100 μm. Thickness may be measured as the height of the material of further region 712 from a surface of further region 712, e.g. a surface of further region 712 in contact with chip 702, to an opposite surface of further region 712. Further region 712 may include a different material from at least one of second region 514 and first region 512, wherein further region 712 may be configured to exhibit a larger strain, i.e. a larger deformation, with respect to its original length, than second region 514 and first region 512. In other words, further region 712 may be more easily bent than second region 514 and first region 512. Further region 712 may be formed directly on chip 702. Further region 712 may be formed over sensor circuit 704.

Second region 514 may be arranged adjacent to further region 712. Second region 514 may be configured to surround chip 702 on one or more sides of chip 702, e.g. second region 514 may be formed over chip 702, e.g. second region 514 may be formed directly on chip 702. Alternatively, second region 514 may be arranged adjacent to further region 712. Second region may be mechanically coupled to sensor circuit 704 through physical coupling with chip 702. Second region 514 may be configured to surround chip-carrier 516 over first chip-carrier side 526 and second chip-carrier side 528. Second region 514 may be configured to surround chip 402 over at least part of top side of chip 402. Second region 514 may be configured to surround chip 702 over at least part of top side of chip 702.

Further region 712 may be configured to at least partially surround at least part of sensor circuit 704. Further region 712 may be mechanically coupled to sensor circuit 704. Further region 712 may be mechanically coupled to sensor circuit 704 through physical coupling with chip 702. Further region 712 may be configured such that it is easier to be deformed with the bending of chip 702 than first region 512 and second region 514. Package structure 706, e.g. further region 712 of package structure 706, may be configured to demonstrate a deformation response to a load applied to the package structure 706, e.g. to further region 712 of package structure 706. Package structure 706, e.g. further region 712 of package structure 706, may be coupled to the sensor circuit 704 via chip 702. Sensor circuit 704 may be configured to detect the deformation response of package structure 706, e.g. the deformation response of further region 712 of package structure 706, through a deformation in chip 702.

Package structure 706, e.g. further region 712 of package structure 706, may be configured such that the bending of package structure 706, may not exceed an elastic limit of chip 402, e.g. a point wherein irreversible bending of the sensor chip is reached, or a breaking point of chip 402, e.g. a point wherein the sensor chip breaks. Therefore, package structure 706 also serves to protect the sensor chip 702.

Chip 702 may have a thickness smaller than that of chip 402. Chip 702 may have a thickness ranging from about 3 μm to about 1 mm, e.g. about 25 μm to about 400 μm, e.g. about 150 μm to about 180 μm. Chip 702 may be a flexible chip, e.g. a bendable chip.

A force may be applied to package structure 706, e.g. to first region 512 and to further region 712 of package structure 706. In other words, an external force applied to chip 402, e.g. to deform chip 402, and to chip 702, e.g. to deform chip 702, may be applied to chips 402 and 702 through package structure 706, e.g. through first region 512 and further region 712 of package structure 706. Package structure 706 may deform in response to the applied load. First region 512 may be more easily deformed than second region 514, therefore, a larger amount of strain may be transferred to chip 402 from first region 512 than second region 514. Further region 712 may be more easily deformed than first region 512, therefore, a larger amount of strain may be transferred to chip 702 than to chip 402.

Therefore, chip 702 may experience a larger amount of bending than chip 402 in response to an applied load. For example, a maximum bending point may be detected in chip 702 before a maximum bending point in chip 402 may be detected. For example, an elastic limit may be detected in chip 702 before an elastic limit in chip 402 may be detected. For example, a breaking point may be detected in chip 702 before a breaking point in chip 402 may be detected. Therefore, sensor circuit 704 may exhibit a larger sensitivity to an applied load than sensor circuit 404. Furthermore, the sensitivity range is increased due to the presence of two chips with different deformation responses to an applied load.

According to various embodiments, first region 512 of sensor arrangement 700 may be modified to include the features of first region 612, e.g. the thickness gradient, described with respect to sensor arrangement 600 of FIG. 6. According to various embodiments, further region 712 of sensor arrangement 700 may be modified to include the features of first region 612 described with respect to sensor arrangement 600 of FIG. 6. In other words, further region 712 of package structure 706 may include one or more regions which are easier to be deformed than other regions in further region 712.

Figure 8:
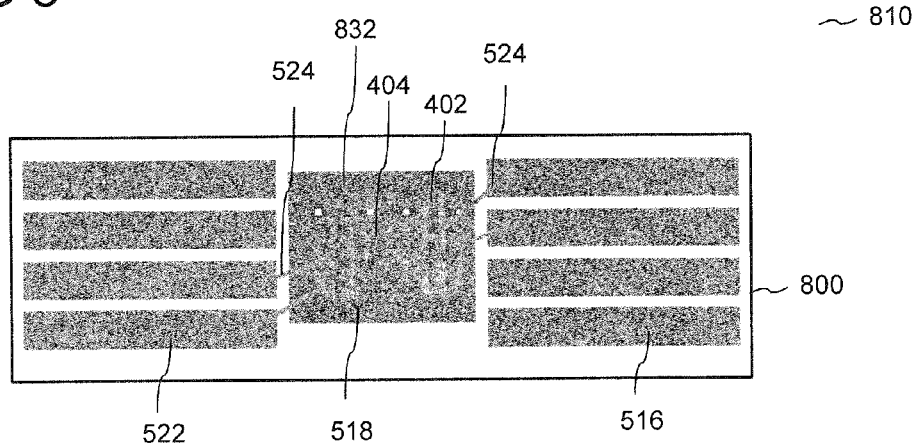
FIG. 8 shows a sensor arrangement according to an embodiment.

FIG. 8 shows a top view of sensor arrangement according to an embodiment. Sensor arrangement 800 may include any of sensor arrangements 400, 500, 600 and 700. Sensor arrangement 800 may for example show a top view of sensor arrangement 700, showing how chip 702 may be connected to the leads. Sensor arrangement 800 shows how the leadframe itself may be arranged, as FIG. 7 shows only a side projection.

Chip-carrier 516 may include a lead frame. Second chip-carrier region 522 may include electrical connectors, e.g. leads of a lead frame. One or more electrical connectors 524 may be configured to connect one or more circuits in chip 402 to chip-carrier 516. Chip 402, or chip 702, may be arranged over chip-carrier 516, e.g. over an electrically conductive substrate 832 surface portion of chip-carrier 516, e.g. over first chip-carrier region 518. Sensor arrangement 800 may include a PSSO package, wherein leads may be arranged on a one side instead of on both sides.

Figure 9:
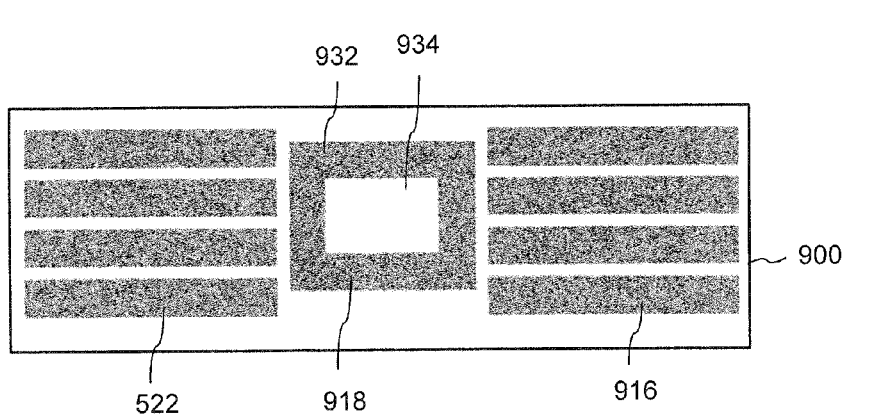
FIG. 9 shows a sensor arrangement according to an embodiment.

FIG. 9 shows sensor arrangement 900 according to an embodiment. Sensor arrangement 900 may include any of sensor arrangements 400, 500, 600, 700 and 800.

FIG. 9. shows sensor arrangement 900 according to an embodiment wherein chip-carrier 516 may be modified to chip-carrier 916 described herein. First chip-carrier region 518 may be modified to first chip-carrier region 918 Chip-carrier 916 may include first chip-carrier region 918 and second chip-carrier region 522. Chip-carrier 916 may be configured to include all the functionalities of chip-carrier 516 described above. First chip-carrier region 918 may be configured to include all the functionalities of first chip-carrier region 518 described above. First chip-carrier region 918 may include platform 932, e.g. an electrically conductive substrate, over which a chip, e.g. chip 402, e.g. chip 702, may be carried. Platform 932, which may form part of chip-carrier 916, i.e. the leadframe, may include a hole 934, e.g. a cavity 934, wherein, it is easier to be deformed in first chip-carrier region 918 than in second chip-carrier region 522. Cavity 934 may be arranged below the chip, e.g. chip 402, e.g. chip 702. In other words, part of the leadframe may be configured to include a hole below the chip to destabilize the system. First chip-carrier region 918 may be configured such that it is easier to be deformed with the bending of the chip, e.g. chip 402, e.g. chip 702 than second chip-carrier region 522. Modified first chip-carrier region 918 may be easier to be deformed than first chip-carrier region 518.

Modified first chip-carrier region 918 may further increase the amount of deformation that may be experienced by chip 402, which may be in physical connection with modified first chip-carrier region 918. Therefore, chip 402 may experience a larger amount of bending than with first chip-carrier region 518. Therefore, sensor circuit 404 may exhibit a larger sensitivity to an applied load with modified first chip-carrier region 918.

Figure 10:
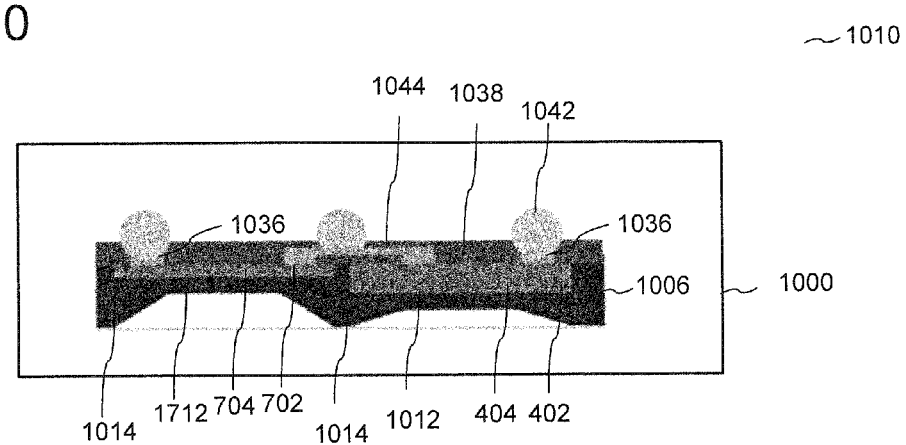
FIG. 10 shows a sensor arrangement according to an embodiment.

FIG. 10 shows sensor arrangement 1000 according to an embodiment. Sensor arrangement 1000 may include a stress sensor package, e.g. an embedded wafer level package, e.g. an embedded wafer level ball grid array stress sensor package, e.g. a flip chip package.

Sensor arrangement 1000 may include an eWLB stress sensor package with different mold thicknesses and different sensor thicknesses: Sensor arrangement 1000 may include one or more chips. Sensor arrangement 1000 may include a chip such as chip 402. Sensor arrangement 1000 may include a chip such as chip 702. FIG. 10 shows sensor arrangement 1000 including chip 402 and chip 702. Chip 402 and chip 702 may be arrange such that a further isolation material 1038 may be configured to cover a front side of chip 402 and chip 702. One or more electrical contacts 1036 may be formed over each front side of chips 402, 702. One or more electrical contacts 1036 may be configured to be in electrical contact with one or more active components, e.g. measurement circuit 404, formed on chip front side. Each of one or more electrical contacts 1036 may be electrically connected to an electrically conductive solder ball 142. Each of chips 402, 702 may be connected to an external electrical circuit via solder ball 142 and electrical contact 1036. Each of sensor circuits 404, 704 may be contacted to an external circuit via solder ball 142 and electrical contact 1036.

Chip 402 may include sensor circuit 404 configured to detect a bending of chip 402. Chip 702 may include sensor circuit 704 configured to detect a bending of chip 702. Chip 702 may be thinner than chip 402.

Sensor arrangement 1000 may include package structure 1006 configured to protect chip 402 and chip 702. Package structure 1006 may include a material configured to electrically isolate chip 402 and chip 702, and to physically protect chip 402 and chip 702. Package structure 1006 may include an isolation material. Package structure 1006 may include at least one from the following group of materials, the group consisting of: filled or unfilled epoxy, pre-impregnated composite fibers, laminate, a mold material, a thermoset material, a thermoplastic material. Package structure 1006 may be configured to surround chip 402 and chip 702 on one or more sides of chip 402 and chip 702, e.g. package structure 1006 may be formed over chip 402, e.g. package structure 1006 may be formed over chip 702. Package structure 1006 may be formed over bottom side, e.g. the back side of chips 402, 702. In other words, over a side of chips 402, 702 which is opposite to the side, e.g. the front side, over which further isolation material 1038, electrical contacts, 1036 and solder ball 1042 are formed.

Package structure 1006 may be formed directly on chips 402, 702. Package structure 1006 may include first region 1012 and second region 1014. Package structure 1006 may be configured such that it is easier to be deformed in first region 1012 than in second region 1014. First region 1012 may be thinner than second region 1014. For example, first region 1012 may include a thickness ranging from about 30 μm to about 3 mm, e.g. about 50 μm to about 500 μm, e.g. about 70 μm to about 250 μm. Second region 514 may include a thickness ranging from about 50 μm to about 3 mm, e.g. about 70 μm to about 800 μm, e.g. about 90 μm to about 300 μm. Thickness may be measured as the height of the material of first region 1012 from a surface of first region 1012, e.g. a surface of first region 1012 in contact with chip 402, to an opposite surface of first region 1012. First region 1012 may include a different material from second region 1014, wherein first region 1012 may be configured to exhibit a larger strain, i.e. a larger deformation, with respect to its original length, than second region 1014.

Package structure 1006 may include one or more further regions 1712, wherein the package structure may be configured such that it is easier to be deformed in the one or more further regions 1712 than in the first region 1012.

Further region 1712 of package structure 1006 may include a material configured to electrically isolate chip 702, and to physically protect chip 702. Further region 712 of package structure 706 may be configured to surround chip 702 on one or more sides of chip 702, e.g. formed over chip 702, e.g. further region 712 of package structure 706 may be formed directly on chip 702.

Further region 712 of package structure 706 may be configured such that it is easier to be deformed in further region 712 than in second region 1014 and in first region 1012. Easier to be deformed may be interpreted to mean that in response to a predetermined load, further region 1712 may exhibit a larger strain, i.e. a larger deformation, than second region 1014 and first region 1012.

Further region 1712 of package structure 1006 may be thinner than first region 1012. For example, Further region 1712 may include a thickness ranging from about 10 lam to about 3 mm, e.g. about 20 µm to about 250 µm, e.g. about 50 µm to about 100 µm. Thickness may be measured as the height of the material of further region 1712 from a surface of further region 1712, e.g. a surface of further region 1712 in contact with chip 702, to an opposite surface of further region 1712. Further region 1712 may include a different material from at least one of second region 1014 and first region 1012, wherein further region 1712 may be configured to exhibit a larger strain, i.e. a larger deformation, with respect to its original length, than second region 1014 and first region 1012. Further region 1712 may be formed directly on chip 702. Further region 712 may be formed over sensor circuit 704. Chip 702 may be thinner than chip 402 as described according to FIG. 7.

Second region 1014 may be arranged adjacent to first region 1012. Second region 1014 may be configured to surround chip 402 on one or more sides of chip 402, e.g. second region 1014 may be formed over chip 402, e.g. second region 1014 may be formed directly on chip 402. Second region 1014 may be formed at least partially over the bottom side of chip 402 and a bottom side of chip 702, e.g. the back side of chips 402, 702. In other words, over a side of chips 402, 702 which is opposite to the side, e.g. the front side, over which further isolation material 1038, electrical contacts, 1036 and solder ball 1042 are formed.

Second region may be mechanically coupled to sensor circuit 404 through physical coupling with chip 402. Second region 1014 may be configured to surround chip 702 on one or more sides of chip 702, e.g. second region 1014 may be formed over chip 702, e.g. second region 1014 may be formed directly on chip 702. Alternatively, second region 1014 may be arranged adjacent to further region 1712. Second region may be mechanically coupled to sensor circuit 704 through physical coupling with chip 702.

First region 1012 may be configured to at least partially surround at least part of sensor circuit 404. First region 1012 may be mechanically coupled to sensor circuit 404. First region 1012 may be mechanically coupled to sensor circuit 404 through physical coupling with chip 402. First region 1012 may be configured such that it is easier to be deformed with the bending of chip 402 than second region 1014. Package structure 1006, e.g. first region 1012 of package structure 1006, may be configured to demonstrate a deformation response to a load applied to the package structure 1006, e.g. to first region 1012 of package structure 1006. Package structure 1006, e.g. first region 1012 of package structure 1006, may be coupled to sensor circuit 404 via chip 402. Sensor circuit 404 may be configured to detect the deformation response of package structure 1006, e.g. first region 1012 of package structure 1006, through a deformation in chip 402. First region 1012 may be formed at least partially over the bottom side of chip 402.

Further region 1712 may be configured to at least partially surround at least part of sensor circuit 704. Further region 1712 may be mechanically coupled to sensor circuit 704. Further region 1712 may be mechanically coupled to sensor circuit 704 through physical coupling with chip 702. Further region 1712 may be configured such that it is easier to be deformed with the bending of chip 702 than first region 1012. Package structure 1006, e.g. further region 1712 of package structure 1006, may be configured to demonstrate a deformation response to a load applied to the package structure 1006, e.g. to further region 1712 of package structure 1006. Package structure 1006, e.g. further region 1712 of package structure 1006, may be coupled to the sensor circuit 704 via chip 702. Sensor circuit 704 may be configured to detect the deformation response of package structure 1006, e.g. a deformation response to a load applied to further region 1712 of package structure 1006, through a deformation in chip 702. Further region 1712 may be formed at least partially over the bottom side of chip 702.

Package structure 1006, e.g. first region 1012 of package structure 1006, may be configured such that the bending of package structure 1006, may not exceed an elastic limit of chip 402, e.g. a point wherein irreversible bending of the sensor chip is reached, or a breaking point of chip 402, e.g. a point wherein the sensor chip breaks. Furthermore, further region 1712 of package structure 1006, may be configured such that the bending of package structure 1006, may not exceed an elastic limit of chip 702, e.g. a point wherein irreversible bending of the sensor chip is reached, or a breaking point of chip 702, e.g. a point wherein the sensor chip breaks. Therefore, package structure 1006 serves to protect sensor chips 402, 702.

A force, e.g. an applied load, e.g. a bending force, e.g. a turning force, may be applied to package structure 1006. An external force applied to chips 402, 702, e.g. to deform chip 402, 702, may be applied to chips 402, 702 through package structure 1006, e.g. through first region 1012 and further region 1712 of package structure 506. Package structure 1006 may deform in response to the applied load. First region 1012 may be more easily deformed than second region 1014, therefore, a larger amount of strain may be transferred to chip 402 from first region 1012 than second region 1014. Further region 712 may be more easily deformed than first region 512, therefore, a larger amount of strain may be transferred to chip 702 than to chip 402. Therefore, sensor circuit 704 may exhibit a larger sensitivity to an applied load than sensor circuit 404.

Figure 11:
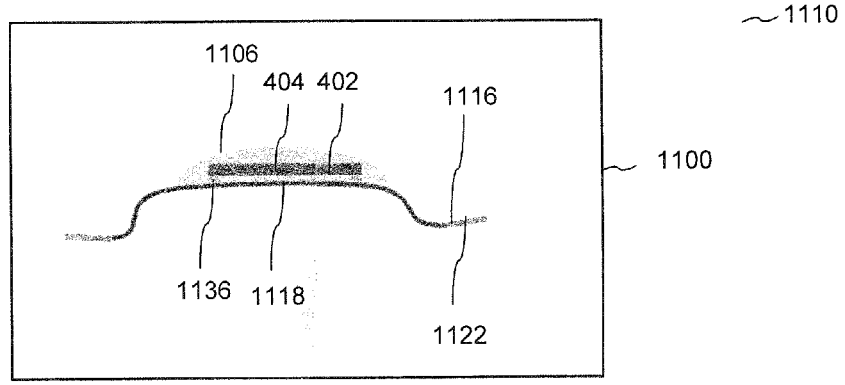
FIG. 11 shows a sensor arrangement according to an embodiment.

FIG. 11 shows sensor arrangement 1100 according to an embodiment. Chip 402 including sensor circuit 404 may be formed over a flexible chip-carrier 1116. Chip-carrier 1116 may include chip-carrier 516 described above. Chip-carrier 1116 may include a flex tape. Chip-carrier 1116 may include a resin. Chip 402 may be arranged over chip-carrier 1116, wherein chip 402 may be arranged face-down over chip-carrier 1116. In other words, chip-carrier 1116 may be configured to carry chip 402 from chip 402 front side. Chip front side 402 may include one or more electrical contacts 1136 formed on front side of chip 402. Chip 402 may be surrounded by a package structure 1106, which may include a resin, or a globe-top protection material. Package structure 1106 may be configured to surround chip 402 over one or more sides, e.g. over chip back side, and over at least part of chip front side. Package structure 1106 may be configured to influence the deformation of chip 402 in response to a load applied to package structure 1106. Package structure 1106 may be configured to bend in response to an applied load, thereby causing chip 402 to bend. Bending of chip 402 in response to bending of package structure 1106 may be measured by sensor circuit 404.

Figure 12:
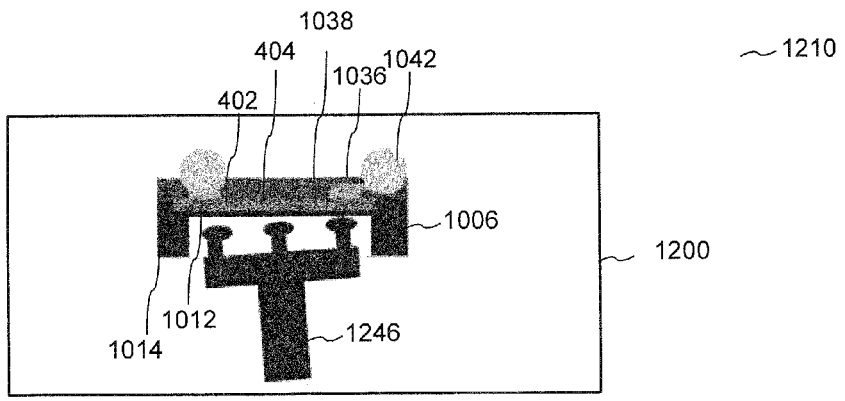
FIG. 12 shows a sensor arrangement according to an embodiment.

FIG. 12 shows sensor arrangement 1200 according to an embodiment. Sensor arrangement 1200 may include an eWLB stress sensor package, e.g. an embedded wafer level package, e.g. an embedded wafer level ball grid array stress sensor package, e.g. a flip chip package, as described with respect to sensor arrangement 1000 in FIG. 10. Sensor arrangement 1200 may include lead frame package as described with respect to sensor arrangements of 500, 600, 700 800, 900. Sensor arrangement 1200 may include a single chip or one or more chips, e.g. a stack of chips, e.g. adjacent chips as described with respect to sensor arrangement 1000.

FIG. 12 shows sensor arrangement 1200 which may include a sensor arrangement as described with respect to sensor arrangement 1000 above. Sensor arrangement 1200 may include first region 1012, second region 1014, electrical contacts 1036, solder ball 1042, further isolation material 1038, chip 402 and sensor circuit 404 described above.

First region 1012 may be mechanically coupled with a force applying medium 1246, configured to apply a force on first region 1012. Force applying medium 1246 may include a joystick. A force, e.g. an applied load, e.g. a bending force, e.g. a turning force, may be applied to package structure 1006 via force applying medium 1246.

Wherein sensor arrangement 1200 may include a plurality of chips, e.g. chip 402 and chip 702, first region 1012 and further region 1712 may be mechanically coupled with force applying medium 1246, configured to apply a force on first region 1012 and further region 1712. Force applying medium 1246 may include a joystick. A force, e.g. an applied load, e.g. a bending force, e.g. a turning force, may be applied to package structure 1006 via force applying medium 1246.

Figure 13:
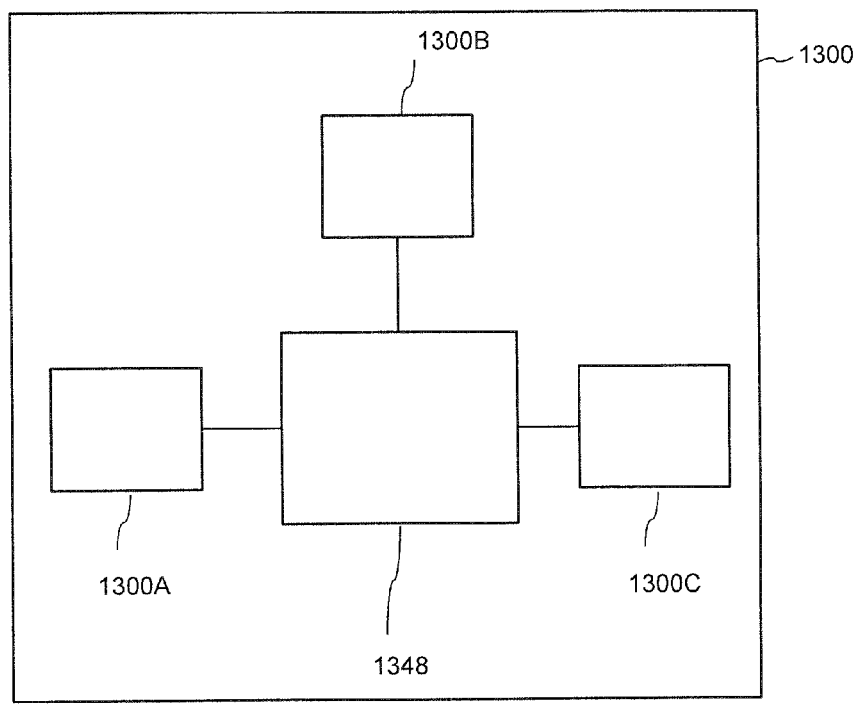
FIG. 13 shows a sensor arrangement according to an embodiment.

FIG. 13 shows sensor arrangement 1300 according to an embodiment. Sensor arrangement 1300 may a plurality of sensor arrangements 1300A, 1300B, 1300C. Each of sensor arrangements 1300A, 1300B, 1300C may include a sensor arrangement as described according to sensor arrangements 500, 600, 700 800, 900, 1000, 1100, 1200 described above. Sensor arrangement may include a controller circuit 1348, e.g. a microcontroller circuit, wherein the controller circuit may be configured to control sensor arrangements 1300A, 1300B, 1300C. Controller circuit 1348 may include any kind of programmable or hard wired logic, e.g. a programmable processor such as e.g. a microprocessor. The controller circuit 1348 may e.g. include an Application Specific Integrated Circuit (ASIC) controller circuit or a Field Programmable Gate Array (FPGA) or a Programmable Logic Array (PLA).

Various embodiments may provide a means for simple and inexpensive detection of mechanical stress, which may allow for continual monitoring of materials demands and degradation.

Various embodiments provide a housing for a semiconductor chip, which may define mechanical stress transfers onto the chip in an environment to be measured after assembly onto the chip.

Various embodiments provide a measurement device, including a chip including a measurement circuit for measuring deformation of a chip, an isolation material configured to at least partially surround the chip and to receive an applied load for deforming the chip, the isolation material including a first isolation region and a second isolation region; wherein the first isolation region is configured to have a different deformation response to the applied load than the second isolation region, and wherein the first isolation region is configured to influence the deformation of the chip more than the second isolation region.

Various embodiments provide a chip package, including an isolation material configured to receive an applied load for deforming a chip, the chip including a measurement circuit for measuring deformation of the chip; wherein the isolation material is configured to at least partially surround the chip, and wherein the isolation material includes a first isolation region and a second isolation region; wherein the first isolation region is configured to have a different deformation response to the applied load than the second isolation region, and wherein the first isolation region is configured to influence the deformation of the chip more than the second isolation region.

Various embodiments provide a chip package, including: a package structure configured to protect a chip including a sensor circuit configured to detect a bending of the chip; wherein the package structure includes a first region and a second region, and wherein the package structure is configured such that it is easier to be deformed in the first region than in the second region.

Various embodiments provide a sensor arrangement, the sensor arrangement including a chip including a sensor circuit configured to detect a bending of the chip; and a package structure configured to protect the chip; wherein the package structure includes a first region and a second region, and wherein the package structure is configured such that it is easier to be deformed in the first region than in the second region.

According to an embodiment, the first region is arranged adjacent to the chip.

According to an embodiment, the first region is configured to at least partially surround at least part of the sensor circuit.

According to an embodiment, the first region is mechanically coupled to the sensor circuit.

According to an embodiment, the first region is configured such that it is easier to be deformed with the bending of the chip than the second region.

According to an embodiment, the first region is thinner than the second region.

According to an embodiment, the chip includes at least one from the following group of sensors, the group consisting of: a temperature sensor, a humidity sensor, a chemical sensor, a biochemical sensor, a stress sensor.

According to an embodiment, the chip includes a thickness ranging from about 5 µm to about 1 mm.

According to an embodiment, the chip is mounted onto a printed circuit board, wherein the printed circuit board is configured to bend with the bending of the chip.

According to an embodiment, the chip includes at least one from the following group of materials, the group consisting of: silicon, a polymer, plastic, a compound semiconductor, a III-V semiconductor, a II-VI semiconductor.

According to an embodiment, the chip includes a stack of a plurality of chips.

According to an embodiment, the package structure includes at least one from the following group of materials, the group consisting of: filled or unfilled epoxy, pre-impregnated composite fibers, laminate, a mold material, a thermoset material, a thermoplastic material.

According to an embodiment, the sensor arrangement further includes a chip-carrier configured to carry the chip; wherein the chip-carrier includes a first chip-carrier region and a second chip-carrier region, and wherein the chip-carrier is configured such that it is easier to be deformed in the first chip-carrier region than in the second chip-carrier region.

According to an embodiment, the first chip-carrier region is arranged adjacent to the chip.

According to an embodiment, the first chip-carrier region is configured such that it is easier to be deformed with the bending of the chip than the second chip-carrier region.

According to an embodiment, the first region is arranged adjacent to the first chip-carrier region.

According to an embodiment, the chip-carrier includes a leadframe.

According to an embodiment, the chip-carrier includes at least one from the following group of materials, the group consisting of: tape, flexible tape, flex tape, a polymer, a plastic, a polymer resin, copper, an electrically conductive material, a thermally conductive material.

According to an embodiment, the sensor arrangement includes a flip chip package.

According to an embodiment, the sensor arrangement includes an embedded wafer level package.

According to an embodiment, the first region includes one or more regions which are easier to be deformed than other regions in the first region.

According to an embodiment, the package structure includes one or more further regions, wherein the package structure is configured such that it is easier to be deformed in the one or more further regions than in the first region.

Various embodiments provide a measurement device, including a chip including a measurement circuit for measuring deformation of a chip, an isolation material configured to at least partially surround the chip and to receive an applied load for deforming the chip, the isolation material including a first isolation region and a second isolation region; wherein the first isolation region is configured to have a different deformation response to the applied load than the second isolation region, and wherein the first isolation region is configured to influence the deformation of the chip more than the second isolation region.

Various embodiments provide a chip package, including an isolation material configured to receive an applied load for deforming a chip, the chip including a measurement circuit for measuring deformation of the chip; wherein the isolation material is configured to at least partially surround the chip, and wherein the isolation material includes a first isolation region and a second isolation region; wherein the first isolation region is configured to have a different deformation response to the applied load than the second isolation region, and wherein the first isolation region is configured to influence the deformation of the chip more than the second isolation region.

Various embodiments provide a chip package, including: a package structure configured to protect a chip including a sensor circuit configured to detect a bending of the chip; wherein the package structure includes a first region and a second region, and wherein the package structure is configured such that it is easier to be deformed in the first region than in the second region.

Various embodiments provide a method for forming a sensor arrangement, the method including: forming a package structure including a first region and a second region to protect a chip, the chip including a sensor circuit for detecting a bending of the chip; wherein the package structure includes a first region and a second region, wherein the first region is more easily deformed than the second region.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A sensor arrangement, comprising:
   a chip comprising a sensor circuit configured to detect a bending of the chip; and
   an integrated package structure configured to protect the chip, the package structure comprising a first region and a second region, wherein the package structure is configured such that it is easier to be deformed in the first region than in the second region,
   wherein the first region is formed at least over and below the sensor circuit and wherein the second region is formed over and below the chip horizontally adjacent and peripheral to the first region and to the sensor circuit, and
   wherein the first region is thinner than the second region.

2. The sensor arrangement according to claim 1,
   wherein the first region is arranged adjacent to the chip.

3. The sensor arrangement according to claim 1,
   wherein the first region is configured to at least partially surround at least part of the sensor circuit.

4. The sensor arrangement according to claim 1,
   wherein the first region is mechanically coupled to the sensor circuit.

5. The sensor arrangement according to claim 1,
   wherein the first region is configured such that it is easier to be deformed with the bending of the chip than the second region.

6. The sensor arrangement according to claim 1,
   wherein the chip comprises at least one from the following group of sensors, the group consisting of: a temperature sensor, a humidity sensor, a chemical sensor, a biochemical sensor, a stress sensor.

7. The sensor arrangement according to claim 1,
   wherein the chip comprises a thickness ranging from about 5 μm to about 1 mm.

8. The sensor arrangement according to claim 1,
   wherein the chip is mounted onto a printed circuit board, wherein the printed circuit board is configured to bend with the bending of the chip.

9. The sensor arrangement according to claim 1,
   wherein the chip comprises at least one from the following group of materials, the group consisting of: silicon, a polymer, plastic, a compound semiconductor, a III-V semiconductor, a II-VI semiconductor.

10. The sensor arrangement according to claim 1,
    wherein the chip comprises a stack of a plurality of chips.

11. The sensor arrangement according to claim 1,
    wherein the package structure comprises at least one from the following group of materials, the group consisting of: filled or unfilled epoxy, pre-impregnated composite fibers, laminate, a mold material, a thermoset material, a thermoplastic material.

12. The sensor arrangement according to claim 1, further comprising:
    a chip-carrier configured to carry the chip;
    wherein the chip-carrier comprises a first chip-carrier region and a second chip-carrier region, and wherein the chip-carrier is configured such that it is easier to be deformed in the first chip-carrier region than in the second chip-carrier region.

13. The sensor arrangement according to claim 12,
    wherein the first chip-carrier region is arranged adjacent to the chip.

14. The sensor arrangement according to claim 12,
    wherein the first chip-carrier region is configured such that it is easier to be deformed with the bending of the chip than the second chip-carrier region.

15. The sensor arrangement according to claim 12, wherein the first region is arranged adjacent to the first chip-carrier region.

16. The sensor arrangement according to claim 12, wherein the chip-carrier comprises a leadframe.

17. The sensor arrangement according to claim 12, wherein the chip-carrier comprises at least one from the following group of materials, the group consisting of: tape, flexible tape, flex tape, a polymer, a plastic, a polymer resin, copper, an electrically conductive material, a thermally conductive material.

18. The sensor arrangement according to claim 1, wherein the sensor arrangement comprises a flip chip package.

19. The sensor arrangement according to claim 1, wherein the sensor arrangement comprises an embedded wafer level package.

20. The sensor arrangement according to claim 1, wherein the first region comprises one or more regions which are easier to be deformed than other regions in the first region.

21. The sensor arrangement according to claim 1, wherein the package structure comprises one or more further regions, wherein the package structure is configured such that it is easier to be deformed in the one or more further regions than in the first region.

22. A measurement device, comprising:
a chip comprising a measurement circuit for measuring deformation of a chip, an isolation material configured to at least partially surround the chip and to receive an applied load for deforming the chip,
the isolation material comprising
a first isolation region and a second isolation region;
wherein the first isolation region is configured to have a different deformation response to the applied load than the second isolation region, and
wherein the first isolation region is configured to influence the deformation of the chip more than the second isolation region,.
wherein the first isolation region is formed at least over and below the measurement circuit and wherein the second isolation region is formed at least over and below the chip horizontally adjacent and peripheral to the first isolation region and to the measurement circuit, and
wherein the first isolation region is thinner than the second isolation region.

23. A chip package, comprising:
an isolation material configured to receive an applied load for deforming a chip, the chip comprising a measurement circuit for measuring deformation of the chip;
wherein the isolation material is configured to at least partially surround the chip, and wherein the isolation material comprises
a first isolation region and a second isolation region;
wherein the first isolation region is configured to have a different deformation response to the applied load than the second isolation region, and
wherein the first isolation region is configured to influence the deformation of the chip more than the second isolation region,
wherein the first isolation region is formed at least over and below the measurement circuit and wherein the second isolation region is formed at least over and below the chip horizontally adjacent and peripheral to the first isolation region and to the measurement circuit, and
wherein the first isolation region is thinner than the second isolation region.

24. A chip package, comprising:
an integrated package structure configured to protect a chip comprising a sensor circuit configured to detect a bending of the chip;
wherein the package structure comprises a first region and a second region, and
wherein the package structure is configured such that it is easier to be deformed in the first region than in the second region,
wherein the first region is formed at least over and below the sensor circuit and wherein the second region is formed over and below the chip horizontally adjacent and peripheral to the first region and to the sensor circuit, and
wherein the first region is thinner than the second region.

25. A method for forming a sensor arrangement, the method comprising:
forming a package structure comprising a first region and a second region to protect a chip, the chip comprising a sensor circuit for detecting a bending of the chip;
wherein the package structure comprises a first region and a second region, wherein the first region is more easily deformed than the second region,
wherein the first region is formed at least over and below the sensor circuit and wherein the second region is formed over and below the chip horizontally adjacent and peripheral to the first region and to the sensor circuit, and
wherein the first region is thinner than the second region.

* * * * *